United States Patent [19]

Novelli

[11] Patent Number: 5,536,178
[45] Date of Patent: Jul. 16, 1996

[54] CIRCUIT INTERCONNECTING DEVICE, FOR USE IN INDUSTRIAL APPLICATIONS

[75] Inventor: Giorgio Novelli, Milan, Italy

[73] Assignee: Elcon Instruments, S.r.l., Italy

[21] Appl. No.: 315,265

[22] Filed: Sep. 29, 1994

[30] Foreign Application Priority Data

Nov. 12, 1993 [IT] Italy ................................. MI9302416

[51] Int. Cl.⁶ ..................................................... H01K 9/09
[52] U.S. Cl. .................................. 439/74; 439/62; 439/65
[58] Field of Search .................................. 439/74, 75, 78, 439/65, 630, 928, 62, 76

[56] References Cited

U.S. PATENT DOCUMENTS 4,683,550  7/1987  Jindrick et al. ......................... 439/74
4,993,965  2/1991  Eck ........................................ 439/65
5,017,146  5/1991  Uehara et al. ......................... 439/65
5,329,428  7/1994  Block et al. .......................... 439/75

OTHER PUBLICATIONS

Electronics; Feb. 24, 1982; pp. 139–141.

Primary Examiner—P. Austin Bradley
Assistant Examiner—Jill De Mello
Attorney, Agent, or Firm—Laff, Whitesel, Conte & Saret, Ltd.

[57] ABSTRACT

A circuit interconnecting device for industrial applications comprising a card-edge connector arranged on a mainboard and associable, by means of a connector located on a card for interconnection, with external control devices; the card for interconnection also exhibiting output connectors as well as a circuit section for interfacing with the external control devices.

3 Claims, 1 Drawing Sheet

CIRCUIT INTERCONNECTING DEVICE, FOR USE IN INDUSTRIAL APPLICATIONS

BACKGROUND OF THE INVENTION

The invention relates to a circuit interconnecting device, for use in industrial applications comprising a plurality of peripheral units which are electrically connected with at least one terminal wiring board, which is in turn connected in output to control devices.

In the industrial field the sheer number of circuits is enormous, rendering wiring-up of often very varied devices an expensive exercise, especially with respect to control panels.

The above is especially relevant with regard to industrial applications where a plurality of peripheral devices have to be wired up with minute care on at least one mainboard, normally situated at the boxed control panel.

This mainboard receives all of the wires coming from the plurality of peripheral devices, all of which are different from one another and obviously have interfaces which are also more or less equally varied.

Bearing in mind the above, it can be seen that the ordering of the various connection wires, bringing them to the respective interface and connecting them up to the mainboard or mainboards is a considerably complicated task.

The task is even more complicated in situations where in-house security systems are concerned, since by their nature these require a heterogeneous plurality of sensors distributed over a whole industrial plant: here the assembly of all the wires on the mainboard is extremely complicated.

For the above reasons devices have been realized which attempt to overcome those problems by wiring the various sensors and/or peripheral devices to groups of like types.

A previous patent by the same applicant, Italian patent no. 2230A/90, solved this problem in part by realizing an interconnecting device which allowed the plurality of wires to be connected in a simple and orderly fashion, so that the origin of each single wire could easily be determined.

This mainboard, however, was not universally applicable to each control apparatus existing in plants downstream of the mainboard itself. In fact, for every control apparatus there had to be an interface for connecting up to the wires in output from the mainboard.

More precisely, once all of the wires originating from the peripheral devices had been orderedly arranged on the mainboard, the signals from the wires had to be transferred to outputs which by their nature are very heterogeneous, ranging from internal security circuits to fire-detecting and prevention circuits to movement circuits, and so on.

The prior art offers simple solutions to these problems, realizing a dedicated connection for each individual case, which, according to the type of application, permits an interconnection wiring to match the signals present.

More in detail, the interfacing of the wires in output from the mainboard is actuated towards a centralized control unit, utilizing specially constructed connectors specified for that particular application and utilizable only for a given plant.

This type of realization, obviously, presents both operative and structural limitations.

From the operative point of view, the supplier is obliged to realize interfaces and interconnectors having circuitries that, being dedicated, can be used only for a given application, and which in commercial terms cannot be made such as to be universally applicable.

Further, from the structural point of view, the above-described dedicated realizations cause problems of stocking and warehousing, since the industrial plant managers have necessarily to keep in a good stock of very specific exchange parts, thus running into high stock numbers.

Finally, since the hardware structures are generally made in accordance with manufacturers' standardizations, presently available interconnecting and interfacing devices are utilizable only in connection with the devices realized by a same manufacturer.

To summarize, the limits of the prior art consist in the fact that the interconnecting devices at present in use are inextricably linked to the choices of hardware made by the supplier and also that within a single typology it is not possible to readapt an item of hardware as it is too dedicated and therefore not liable to reutilization.

SUMMARY OF THE INVENTION

The present invention obviates the above-described drawbacks by providing a circuit interconnector device for industrial plants, in which all the interconnection modalities necessary for normal industrial controls have been integrated, such as to enable the device to be used in various applications with low realization costs over an application range which includes almost all industrial applications, independently of the specific requirement.

This aim and others besides are all attained by a circuit interconnection device in industrial plants, described in more detail hereinafter and set out in the accompanying claims.

BRIEF DESCRIPTION OF THE DRAWING

Further characteristics and advantages of the present invention will better emerge from the detailed description that follows, of an embodiment of the invention, illustrated in the form of a non-limiting example in the accompanying drawing of FIG. 1, which is a schematic perspective view of the device.

DESCRIPTION OF THE PREFERRED EMBODIMENT

Figure 1:
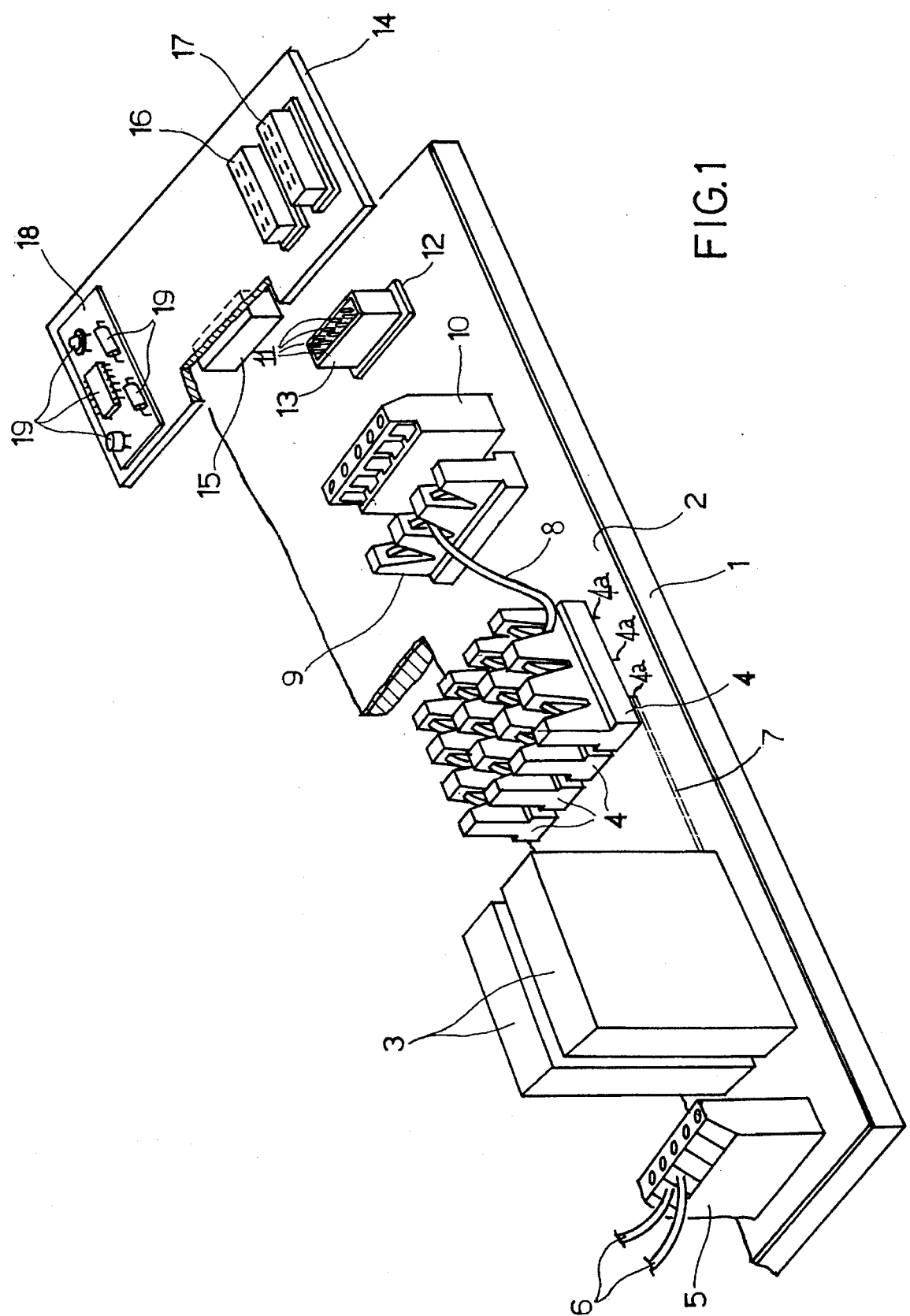

With reference to FIG. 1, a mainboard 1 is provided with an arrangement of connection tracks (not all of which are shown in the figure) over a surface 2. FIG. 1 specifically relates, by way of an applicational example of the invention, to an application for internal security modules, which in the FIGURE are schematically represented by modules 3.

The wiring originating from various sensors distributed about a generic industrial plant is connected to the mainboard 1 by means of a fixing element 5, on which all the wiring is arranged, predisposed on the mainboard 1.

All the connections from the modules 3 are carried through tracks 7 running to further connectors 4 fixed on the mainboard 1 by means of pins 4a exhibited thereby and welded thereto.

In output, wires 8 can be connected up through a further wiring element 9, and by means of tracks running on the surface 2 to a fixing terminal 10.

A card-edge pin connector 13 is wired to the mainboard 1 and connected thereto by a support 12. The pin connector 13 is provided with pins 11 to which the tracks 7 coming from the terminal 10 on the mainboard 1 are connected.

A connector 15, housed on a special removable card 14, is associable to the connector 13, advantageously by means of a typical hermaphroditic connection, but with other types of connection being equally utilizable according to specific requirements.

Finally, the card 14 is provided with output connectors 16 and 17, which through circuit tracks (not illustrated) on the card 14 itself connect the connector 15 pins to the pins of the above-mentioned connectors 16 and 17. Possibly a further, preferably removable, circuit section 18 is provided, whereon an interface circuit 19 is arranged for specific interfacing to the control device to be linked up.

In general the circuit configuration of each card 14 is realized according to the control devices supplied by the various manufacturers.

In any case, the removability of the card 14 allows for interconnection and interfacing of any control device coming from any source installed in an industrial plant.

As a general indicator, the device of the present invention has the connector 13 preinstalled on the mainboard 1.

Through the coupling connector 15, the card 14 is connected to the mainboard 1. The connections of the circuit tracks on the surface 2 with the pins 11 of the connector 13 are always of standard type, in that they are configured independently of the specific applicational destination of the mainboard 1.

On the other hand, the cards 14 will surely be each configured in accordance with the use for which it is destined, while the mainboard 1 can be the same for each application, being independent of the particular actuation circuit with which it will interconnect.

Briefly, the connector 13 with its pins 11 and the tracks on the surface 2 of the mainboard 1 will always be the same, whereas the the circuitry on the card 14 can be customized for each application, with special outputs 16 and 17 adapted for special industrial purposes. In addition, if, apart from the interconnection problem, there exists an interfacing problem, the circuitry 19 can be configured such as to allow not only interconnection (that is, a physical connection of the two parts) but also interoperability between two unlike systems.

Obviously the tracks connecting the connector 15 of the card 14 and the output connectors 16 and 17 will be different for each single realization. The said output connectors 16 and 17 will enable connections to programmable control units, external processors, in short all external governing devices.

The invention thus achieves its set aims: indeed, with the device of the present invention it is possible to interconnect and interface any industrial application with a mainboard on which a plurality of devices and/or sensors converge, without having to customize the mainboard on each occasion, but only configuring the interconnection card 14 for a single application. As the card 14 is of limited dimensions and is removable, maintenance is easier, a practically infinite number of applications is possible, reliability is improved and required warehousing space is considerably reduced.

What is claimed:

1. A circuit interconnecting device for industrial applications comprising a plurality of peripheral units electrically connected with at least one mainboard which is in turn connected and interfaced in output with control devices, a card-edge connector arranged on the at least one mainboard;

a removable interconnecting card associated with said card-edge connector by a connector and having output connectors for linking up to the control devices and an interface circuit for the control devices wherein the interface circuit is assembled on a removable circuit section.

2. A device as in claim 1, wherein the card-edge connector is connected by tracks to a fixing terminal.

3. A device as in claim 1, wherein the removable interconnecting card is provided with tracks for linking up the connector arranged thereon with the output connectors.

\* \* \* \* \*